US009077366B2

(12) United States Patent
Jensen et al.

(10) Patent No.: US 9,077,366 B2
(45) Date of Patent: *Jul. 7, 2015

(54) MULTI-MODE ANALOG-TO-DIGITAL CONVERTER

(71) Applicant: Broadcom Corporation, Irvine, CA (US)

(72) Inventors: Henrik Tholstrup Jensen, Long Beach, CA (US); Jianhua Gan, Irvine, CA (US); Seema Anand, Rancho Palos Verdes, CA (US); Aminghasem Safarian, Tustin, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/969,549

(22) Filed: Aug. 17, 2013

(65) Prior Publication Data

US 2013/0331052 A1    Dec. 12, 2013

Related U.S. Application Data

(63) Continuation of application No. 13/170,155, filed on Jun. 27, 2011, now Pat. No. 8,519,878.

(51) Int. Cl.
*H03M 1/12* (2006.01)
*H03M 1/20* (2006.01)
*H03M 3/00* (2006.01)

(52) U.S. Cl.
CPC .............. *H03M 1/201* (2013.01); *H03M 3/332* (2013.01); *H03M 3/396* (2013.01); *H03M 3/406* (2013.01); *H03M 3/456* (2013.01)

(58) Field of Classification Search
CPC ..... H03M 1/201; H03M 3/396; H03M 3/456; H03M 3/406; H03M 3/332
USPC .................................. 341/120, 144, 155, 143
See application file for complete search history.

(56) References Cited

U.S. PATENT DOCUMENTS

| 3,701,146 | A | * | 10/1972 | Haga et al. | 341/118 |
| 4,939,520 | A | * | 7/1990 | Biglow | 341/167 |
| 6,897,796 | B2 | * | 5/2005 | Dias et al. | 341/143 |
| 7,224,299 | B2 | * | 5/2007 | Somayajula | 341/131 |
| 7,301,392 | B2 | * | 11/2007 | Hinrichs et al. | 327/553 |
| 8,223,050 | B2 | * | 7/2012 | Matsumoto et al. | 341/131 |
| 8,519,878 | B2 | * | 8/2013 | Jensen et al. | 341/155 |

* cited by examiner

*Primary Examiner* — Brian Young
(74) *Attorney, Agent, or Firm* — Oblon, McClelland, Maier & Neustadt, L.L.P.

(57) ABSTRACT

Techniques and devices provide analog-to-digital conversion at two or more signal frequencies or frequency bands and can be used to construct multi-mode analog-to-digital converters in various circuits, including receivers and transceivers for wireless communications and radio broadcast environments. Adjustable analog-to-digital converters based on the described techniques can be configured to adjust circuit parameters to adapt the technical specifications of different input signals at different signal frequencies or frequency bands, such as FM, HD-radio, and DAB radio signals in radio receiver applications.

20 Claims, 6 Drawing Sheets

MULTI-MODE ANALOG-TO-DIGITAL CONVERTER

This is a continuation of application Ser. No. 13/170,155 filed Jun. 27, 2011.

TECHNICAL FIELD

This patent document relates to methods and devices for analog-to-digital conversion in various circuits, including receivers and transceivers for wireless communications and radio broadcast.

BACKGROUND

Many electronic circuits include one or more analog to digital converters that convert an analog signal into a digital signal by, e.g., sampling of the analog signal. A radio receiver, for example, includes analog-to-digital converters for digitizing the in-phase component (I) and the quadrature component (Q) of an amplified RF signal received by a radio antenna. The performance requirements of the analog-to-digital converters may differ depending on the characteristics of the received radio signal. A wireless device such as a radio receiver may receive radio broadcast signals in accordance with the FM radio standard (such as 47 C.F.R. 73 Subpart B in the United States), HD-Radio standard, National Radio Systems Committee NRSC-5B In-band/on-channel Digital Radio Broadcasting Standard, and Digital Audio Broadcasting Standard. Some receivers utilize a different set of analog-to-digital converters in order to receive radio signals in accordance with each standard. The additional analog-to-digital converters improve the interoperability of the receiver, but at a penalty of increased circuit area and cost. It is desirable to have improved interoperability for components of wireless devices receiving signals in accordance with different communication standards.

BRIEF DESCRIPTION OF THE DRAWINGS

The components in the figures are not necessarily to scale, emphasis instead being placed upon illustrating various aspects thereof. Moreover, in the figures, like referenced numerals designate corresponding parts throughout the different views.

DETAILED DESCRIPTION

Figure 1:
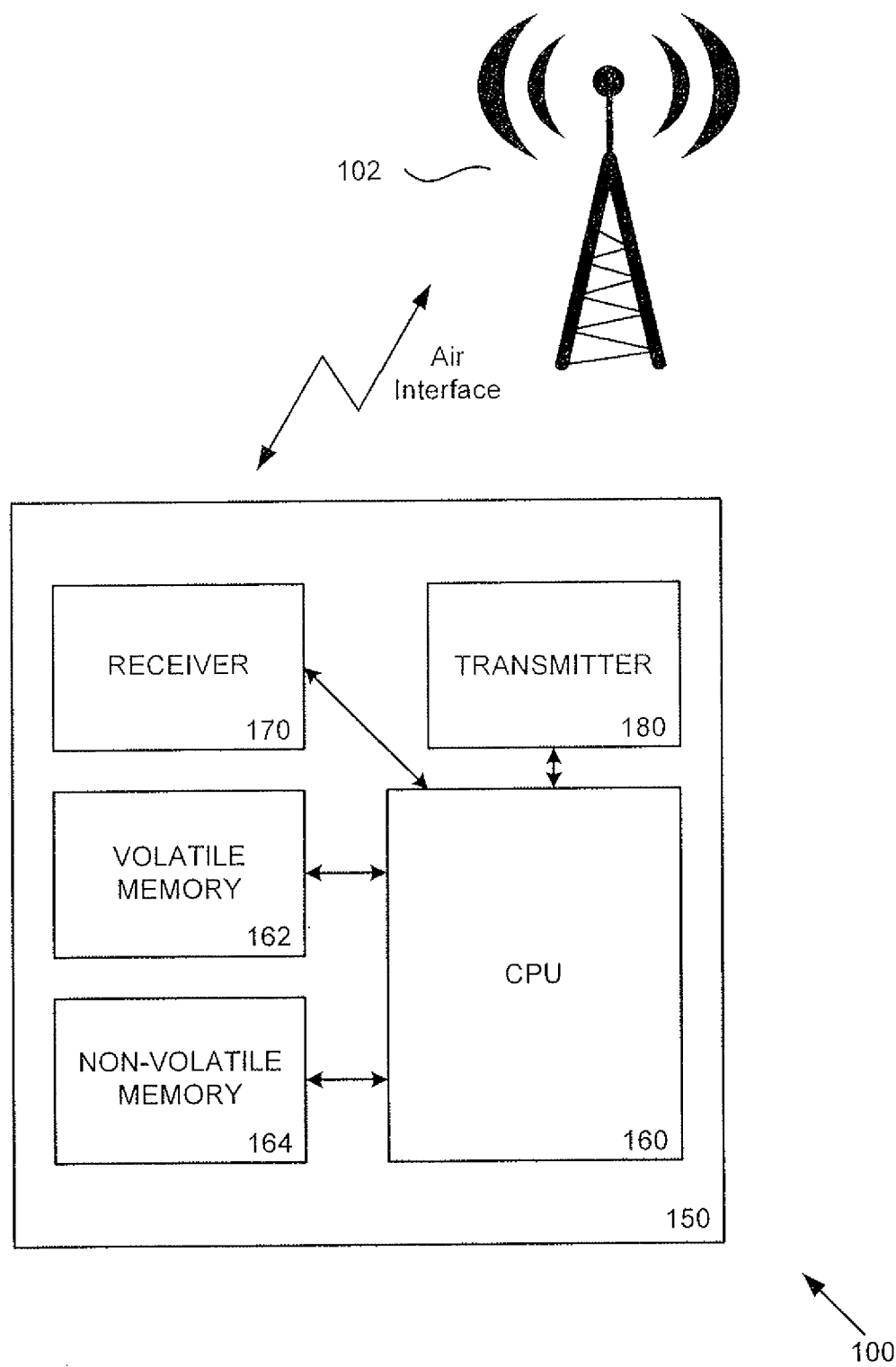
FIG. 1 shows an example of communication system that implements an analog-to-digital converter.

Circuits and devices described in this document use adjustable analog-to-digital converters (ADCs) for digitizing received analog signals at different signal frequencies or frequency bands. Such an adjustable analog-to-digital converter can adjust one or more circuit parameters, e.g., the device gain and/or the center frequency of the device noise transfer function, to adapt for operations at different signal frequencies or frequency bands. Analog-to-digital conversion via the described adjustable analog-to-digital converters can be implemented in the early stage of a signal chain of a device to reduce analog signal processing performance requirements and to increase scope of the digital signal processing to fully benefit various technical advantages of the digital signal processing. The adjustability of the described adjustable analog-to-digital converters over two or more signal frequencies or frequency bands can be beneficial in applications where the same device or chip needs to deliver optimized performance at different signal frequencies or frequency bands, e.g., a wireless communication device over different wireless communication frequencies and a multi-mode radio receiver for receiving radio broadcast signals over different radio standards at different radio frequency bands. In various applications such as wireless communications, radio receivers and others, the described adjustable analog-to-digital converters can be implemented as part of a system-on-chip circuit design to achieve compact device configuration and to reduce power consumption.

Implementations of adjustable analog-to-digital converters are described and can be configured to adjust circuit parameters to adapt the technical specifications of different input signals at different signal frequencies or frequency bands. In one implementation of an integrated circuit radio receiver, for example, the receiver can include receiver circuitry that receives a radio frequency (RF) signal, an analog-to-digital converter for analog-to-digital conversion, and a control circuit for the receiver. The receiver circuitry receives the RF signal based on one of different radio broadcast standards at different radio signal frequency bands and produces an intermediate frequency (IF) analog signal based on the received RF signal. The analog-to-digital converter includes an adjustable circuit including an input port coupled to receive the IF analog signal from the receiver circuitry, an integrator that performs signal integration and an output port producing an integrated analog signal based on the received IF analog signal, and a quantizer coupled to receive the integrated analog signal from the adjustable circuit to produce a digital output based on the received integrated analog signal. The adjustable circuit includes one or more adjustable circuit components that are controlled to change one or more respective component values to change characteristics of the analog-to-digital converter with respect to a frequency band of the IF analog signal to reduce or minimize noise at or near the frequency band in which a digital signal is to be recovered from the digital output of the quantizer. The control circuit is operable to control the one or more adjustable circuit components of the adjustable circuit to adapt operation of the analog-to-digital converter based on requirements of a particular radio broadcast standard when the received RF signal changes from a different radio broadcast standard to the particular radio broadcast standard.

In another implementation, an analog-to-digital converter includes an integrator including an input port coupled to receive an analog input signal and an output port producing an integrated analog signal based on the analog input signal, the integrator including an operational amplifier having a capacitive feedback loop to form an operational amplifier integrator involved in producing the integrated analog signal, an adjustable input resistor coupled to the input port of the integrator and configured to have an adjustable resistance value that adjusts a signal gain of the integrator, an adjustable resistor coupled between the input port and the output port of the integrator and configured to adjust a resistance value to change a frequency of a response of the analog-to-digital converter, and a quantizer coupled to receive the integrated analog signal from the integrator and configured to produce a digital output having a digital value associated with an amplitude of the integrated analog signal. In this implementation, a feedback loop is provided and includes a digital-to-analog converter coupled to receive and to convert the digital output of the quantizer into an analog feedback current and is coupled to feed the analog feedback current to an input port of the operational amplifier of the integrator. A dither generation circuit is coupled to the input port of the operational amplifier to inject a pseudo-random current at the input port of the operational amplifier of the integrator that is coupled to receive the analog feedback current from the feedback loop.

Other techniques for ADC designs are also disclosed in this document. For example, an analog-to-digital converter can include an integrator, a quantizer and a dither generator. The integrator includes an input port coupled to receive an analog input signal and an output port producing an integrated analog signal based on the analog input signal. The quantizer is coupled to receive the integrated analog signal from the integrator to produce a digital output based on the received integrated analog signal. The dither generator is operable to inject a pseudo-random current at a circuit node within the integrator to cause the integrated analog signal to include a pseudo-random component.

Specific examples provided in this document include circuits and devices with multi-mode analog-to-digital converters for digitizing received radio broadcast signals transmitted in accordance with one or more broadcast standards. The multi-mode capabilities of the analog-to-digital converters permit their use in systems with varying gain and operational frequency requirements. The described circuits or devices can be implemented in various applications, including receivers or transceivers for wireless communications and radio broadcast applications.

The described analog-to-digital converters can be used for communication applications and other applications that require analog-to-digital conversion. Communication systems such as cellular telephone systems, the Internet, and point-to-point in-home wireless networks supported wireless communication between wireless communication devices. A communication system may operate based on one or more communication standards, including, but not limited to, IEEE 802.11, Bluetooth, advanced mobile phone services (AMPS), digital AMPS, global system for mobile communications (GSM), Long-Term Evolution (LTE), Evolved High-Speed Packet Access (HSPA+), Code division Multiple Access (CDMA) technologies (e.g., CDMA2000 1x, and High Rate Packet Data (HRPD)), Wideband CDMA (WCDMA) technologies, WiMAX (Worldwide Interoperability for Microwave Access), local multi-point distribution systems (LMDS), multi-channel-multi-point distribution systems (MMDS), and others.

A wireless communication device, such as a cellular telephone, two-way radio, personal digital assistant (PDA), personal computer (PC), laptop computer, home entertainment equipment, communicates directly or indirectly with other wireless communication devices. For direct communications or as point-to-point communications, the participating wireless communication devices tune their receivers and transmitters to the same channel, or channels, (e.g., one or more of the plurality of radio frequency (RF) carriers of the wireless communication system) and communicate over that channel (s). For indirect wireless communications, each wireless communication device communicates with an associated base station (e.g., for cellular services) and/or an associated access point (e.g., for an in-home or in-building wireless network) via one or more assigned channels. To complete a communication connection between the wireless communication devices, the associated base stations and/or associated access points communicate with each other via a system controller, via the public switch telephone network, via the internet, and/or via some other wide area network.

A wireless communication device for bidirectional wireless communications can include a built-in radio transceiver (i.e., receiver and transmitter) or is coupled to an associated radio transceiver (e.g., a station for in-home and/or in-building wireless communication networks, RF modem, etc.). A transmitter converts data into RF signals by modulating the data in accordance with the particular wireless communication standard to produce baseband signals and mixes the baseball signal with a local oscillation in one or inure intermediate frequency (IF) stages to produce the RF signals. The radio receiver may include an antenna section, a filtering section, a low noise amplifier, an intermediate frequency (IF) stage, and a demodulator. The antenna section receives RF signals and provides the received RF signals to a low noise amplifier. The low noise amplifier amplifies the received RF signals and provides them as amplified RF signals to the IF stage. The IF stage steps down the frequency of the RF signals of interest to an intermediate frequency or to base-hand. The intermediate frequency signals or base-band signals are digitized and provided to the demodulator, which recaptures the data in accordance with the demodulation protocol.

A wireless device such as a radio may participate in unidirectional directional wireless communications, such as receiving radio broadcast signals in accordance with the FM radio standard (such as 47 C.F.R. 73 Subpart B in the United States), HD-Radio standard, National Radio Systems Committee NRSC-5B In-band/on-channel Digital Radio Broadcasting Standard, and Digital Audio Broadcasting Standard. Each standard may impose different operating requirements on the analog-to-digital converters used in radio receivers used to receive such broadcast signals.

A configurable analog-to-digital converter within a receiver or transceiver can be configured to allow the receiver or transceiver to receive signals broadcast in different frequency bands while adjusting the receiver circuit to enhance the signal to noise ratio at various frequency bands. For example, the configurable analog-to-digital converter can be tuned to suppress the receiver noise in accordance with the FM radio, HD-Radio, and DAB standards depending on the desired operating mode of the receiver or transceiver. For example, a second order delta sigma analog-to-digital converter may incorporate configurable resistors that permit the gain and notch frequency of the noise transfer function of the converter to be adjusted according to the frequency of an operating mode so that the spectral notch of the noise transfer function where the transfer of the noise power is at or near lowest substantially overlaps with the frequency or frequency band of the signal to be recovered to reduce the noise. Configurable amounts of feedback current may also be provided to each operational amplifier stage, thus permitting operation of the analog-to-digital converter at different clock rates. In addition to adjusting the notch frequency of the noise transfer function of the analog-to-digital converter (ADC), the signal to noise ratio of the ADC can be further improved via shaping the noise power spectrum of the ADC. In this regard, a dither generator injects a random or pseudo-random current at or before an input node to the quantizer. The dither generator may be configurable to shape the power spectral density of the injected noise above the frequency of the received input signal to cause the noise to be filtered out in the output of the ADC due to the low-pass nature of the signal transfer function of the ADC. As such, thus the noise power in a frequency range around the signals of interest to be recovered is significantly reduced or minimized for a given mode of operation, and the signal to noise ratio of the ADC is improved for the given mode of operation. Different radio modes are at different radio frequency bands and have different technical requirements and, accordingly, the dither generator can be configured and controlled to generate different dither currents for different radio modes in order to produce the desired shaping of the noise power spectral density for each of the different radio modes. Furthermore, the data rate of the data input stream to the dither generator may also be reduced to reduce power consumption. The analog-to-digital converter may be thus be configured to digitize received FM radio, HD-Radio, and DAB analog signals with improved signal to noise ratio performance and reduced power consumption.

FIG. 1 shows an example of a communication system 100 that includes an antenna 102 within a network or a radio device such as a radio transceiver or radio transmitter and a wireless communication device 150 in radio communication with the antenna 102. In one implementation, the antenna 102 can be part of a base station for a cellular telephone and data network. In another implementation, the antenna 102 can be part of an access point for an in-home or in-building wireless network. In another implementation, the antenna 102 can be part of a transmitter that transmits FM, HD-Radio, or DAB signals to radio receivers such as the wireless communication device 150. In yet another implementation, the antenna 102 can be part of a transmitter of another wireless communication device that can communicate with the wireless communication device 150.

In the specific example in FIG. 1, the wireless communication device 150 is a radio transceiver device that includes a digital signal processor 160 such as a CPU, a volatile memory 162 and a non-volatile memory 164 associated with operations of the processor 160, a receiver 170 for receiving radio signals, and a transmitter 180 for transmitting radio signals. The CPU 160 may be configured with instructions executable by the CPU. The executable instructions may be stored in volatile memory 162 within the wireless communication device 150, or non-volatile memory 164, such as a read-only memory (ROM), EEPROM (Electrically Erasable and Programmable Read Only Memory), or E-flash (embedded flash) within the receiver 150. The executable instructions that configure the CPU 160 may implement a number of software modules or applications that communicate with one another and with hardware and software inside and outside of the host 150, in order to implement the functions of a wireless communication device 150. For example, the CPU 160 may configure and receive data from the receiver 170 and may configure and send data to transmitter 180 for transmission. In some implementations, the wireless communication device 150 can incorporate functionality found in the BCM4330 IEEE 802.11a/b/g/n MAC/Baseband/Radio with integrated Bluetooth 4.0+HS and FM Transceiver, available from Broadcom Corporation in Irvine, Calif., United States of America. Notably, the receiver 170 includes two multi-mode analog to digital converters for digitizing the in-phase component (I) and the quadrature component (Q) of a received, amplified RF signal received by a radio antenna 102.

While the wireless communication device 150 shown in FIG. 1 is a transceiver, in another embodiment, the wireless communication device 150 may be configured to include only a receiver 170 without having a transmitter 180. Such a device may be utilized in unidirectional communication systems where a wireless communication device 150 receives communications from the antenna 102.

Figure 2:
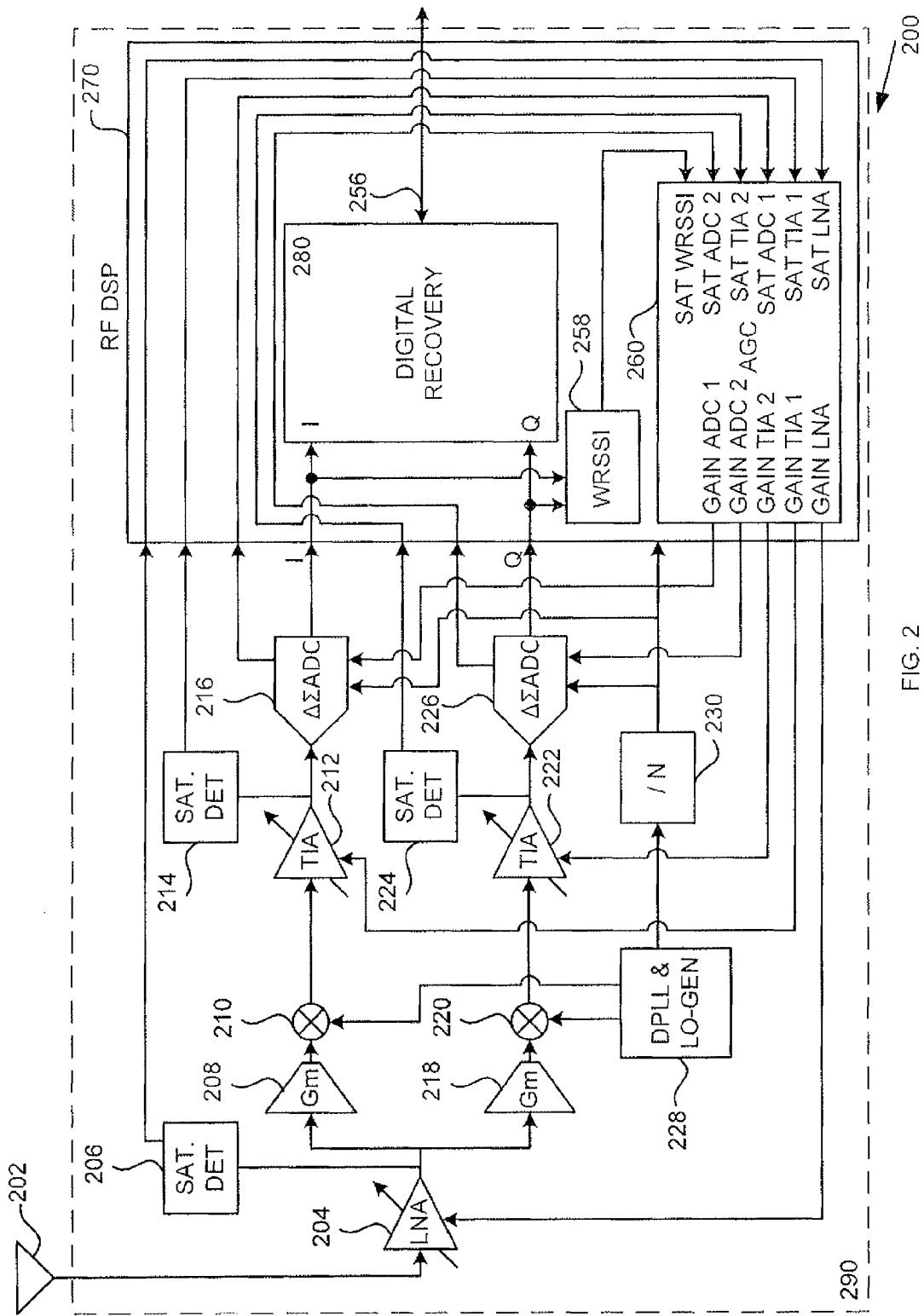
FIG. 2 is a diagram illustrating an exemplary receiver incorporating analog-to-digital converters.

FIG. 2 is a diagram illustrating an exemplary receiver 200 incorporating analog-to-digital converters. The receiver 200 may be utilized in the wireless communication device 150 of FIG. 1, such as the receiver 170 of FIG. 1. The receiver 200 includes an input port that receives an inbound radio frequency (RF) signal via the antenna 202. The inbound RF signal may be originated or transmitted by a base station, access point, or another wireless communication device. In one embodiment, the antenna 202 is an external antenna coupled to the remaining circuitry 290 of the receiver 200 of FIG. 2. For example, the circuitry 290 shown in FIG. 2 is implemented in an integrated circuit or printed circuit board, and the antenna is an external antenna coupled to the integrated circuit or printed circuit board. In another embodiment, the antenna 202 is implemented on the same integrated circuit or printed circuit board as the remaining circuitry 290 of the receiver 200. Hence, various integrated configurations can be used to form an integrated circuit radio receiver based on the design in FIG. 2.

The received RE signal is amplified by a variable gain low-noise amplifier (LNA) 204 to a level acceptable for processing in subsequent stages of the receiver 200. The amplified RF signal is split into two signals that are converted to voltage signals using voltage-to-current converters 208 and 218, respectively. In one embodiment, the low-noise amplifier 204 and voltage to current converters 208 and 218 can be integrated into a single module, where the two output signals of the combined module are provided to first and second mixers 210 and 220.

The voltage outputs of the voltage-to-current converters 208 and 218 are provided to the first and second mixers 210 and 220 for mixing with respective local oscillator signals. The first mixer 210 mixes an in-phase component of the received, amplified RE signal with an in-phase component (I) of the receiver local oscillator 228. The second mixer 220 mixes a quadrature component (Q) of the received, amplified RE signal with a quadrature component of the receiver local oscillator 228.

The receiver local oscillator 228 can be a digital phase-locked loop (DPLL) local frequency synthesizer, and provides two phase-shifted local oscillator reference RF signals (e.g., 90-degree phase shifted cosine and sine signals) to the first and second mixers 210 and 220 that produce in-phase (I) and quadrature (Q) signals. The receiver local oscillator 228 also provides the basic clock signals for other parts of the receiver 200. For example, a divider module 230 is provided to divide the clock output of the receiver local oscillator 228 by a programmable integer amount, N, for use in analog-to-digital converters (ADCs) 216 and 226 and an RF digital signal processing (DSP) block 270 downstream from the ADCs 216 and 226. Within the RE DSP 270, the clock signal from the divider 230 is used at various parts within the RF DSP 270 at either the same clock rate of the output of the divider 230 or at one or more lower clock rates.

The mixed I and Q signals output from the first and second mixers 210 and 220 are amplified by tunable trans-impedance amplifiers 212 and 222, and are then converted from the analog format into the digital format via analog-to-digital converters 216 and 226. In some implementations, the analog-to-digital converters 216 and 226 can be implemented by sigma-delta ADC converters. In some implementations, the analog-to-digital converters 216 and 226 may amplify the signals before conversion to digital signals and thus provide another stage of signal amplification in the receiver 200 in addition to the signal amplification by the amplifiers 204, 212 and 222.

The RF DSP 270 is the digital portion of the receiver 200 and may be referred to as the baseband DSP of the receiver 200. In an example where the receiver 200 is a radio receiver, the RF DSP 270 can process the outputs from the ADCs 216 and 226 to generate the audio signal for the radio receiver. In FIG. 2, the RF DSP 270 includes a digital recovery module 280 that combines the in-phase sequence of data (I) and the quadrature phase sequence of data (Q), which are outputs of analog-to-digital converters 216 and 226, to provide the recovered sequence of data 256 after compensating for imbalances. The digital recovery module 280 can, for example, decode, descramble, constellation demap, and/or demodulate the digital reception formatted data output from analog-to-digital converters 216 and 226 to recover data 256 in accordance with the particular wireless communication standard being received at the antenna 202. More specifically, the in-phase sequence of data and the quadrature phase sequence of data may represent imbalanced sequences as a result of I/Q imbalances. The digital recovery module 280 may determine the sequence parameter values corresponding to the sequence parameters by observing the one or more observational interferers and/or the images of the one or more observational interferers embedded with the in-phase sequence of data and/or the quadrature phase sequence of data to allow for real-time adjustment of the sequence parameter values to compensate for the I/Q imbalances before demodulation and recovery of the sequence of data 256. The extracted data sequence of digital data 256 may be provided to another part of the RF DSP 270 or the digital signal processor 160 (e.g., a CPU) of FIG. 1.

The digital portion 270 of the receiver 200 may be implemented in hardware, software (including firmware), or a combination of hardware and software to perform the specified functionality. For example, in some implementations, the digital portion 270 may include a processor configured with processor-executable instructions to implement the desired functionality.

The operation of the receiver 200 is based on accurate and timely setting of the controls of the variable gain blocks such as the low noise amplifier 204, the transimpedance amplifiers (TNA) 212 and 222, and the amplifiers in the analog-to-digital converters 216 and 226. Specifically, the variable gain of these amplifiers 204, 212, and 222, and the amplifiers in analog-to-digital converters 216 and 226, can be based on a number of factors, such as the RF signal received at the antenna 202. If the gain controls are not properly set, the receiver may suffer from reduced sensitivity (gain set too low) or may malfunction due to node saturation (gain set too high).

To optimize the gain control in the receiver 200, a saturation detector 206 determines whether the amplified received RF signal is substantially large in amplitude but not too large to cause undesired saturation. If the amplified received RF signal is substantially large in amplitude, the gain of the low-noise amplifier 204 is reduced to avoid saturation of the amplified received RF signal. The saturation detector 206 may also determine if the amplitude of the amplified signal is too low. If so, the gain of the low-noise amplifier 204 is increased.

Similarly, the above saturation detection can be implemented in the subsequent stage of signal amplification. Saturation detectors 214 and 224 are coupled at the outputs of the TNA amplifiers 212 and 22 and determine whether outputs of the transimpedance amplifiers 212 and 222 are substantially large in amplitude. If the amplified output of the transimpedance amplifiers 212 and 222 is substantially large in amplitude, the gain of the transimpedance amplifiers 212 and 222 is reduced. The saturation detectors 214 and 224 also determine whether outputs of the transimpedance amplifiers 212 and 222 are too small in amplitude. If outputs of the transimpedance amplifiers 212 and 222 are too small in amplitude, the gain of the transimpedance amplifiers 212 and 222 is increased.

In the example in FIG. 2, the RF DSP 270 is configured to determine the Wideband Received Signal Strength Indication (WRSSI) by digitally calculating a magnitude of a signal, e.g., a received RF signal or representation thereof, such as an I/Q signal pair input to the digital portion 270 of the receiver 200. The WRSSI can be determined by a WRSSI module 258 that is coupled to receive the I and Q signals from the DACs 216 and 226 and to perform the WRSSI processing. The signal magnitudes of the I/Q signal pair may be used to optimally adjust the gain of an amplifier in the analog-to-digital converters 216 and 226. For example, the WRSSI module 258 filters the magnitude of the I/Q signal pair to produce a filtered magnitude signal. The process then continues by determining a coarse Received Signal Strength Indication (RSSI) value of the filtered magnitude signal, wherein the coarse RSSI value indicates a sliding window of RSSI values, Once the coarse RSSI value is obtained, the process continues by determining a fine RSSI value within the sliding window of RSSI values. In another example, the digital calculation of an RSSI value begins by digitally calculating a magnitude signal from digital I/Q signals. The process continues by determining a range of WRSSI values from the magnitude signal. The process concludes by determining whether the WRSSI value is within the range of WRSSI values.

In the signal path of the received signal from the antenna 202 to the digital portion 270 of the receiver 200 of FIG. 2, there are three stages of amplification under control of an automatic gain control (AGC) circuit or module 260. The first amplification stage includes a first-stage amplifier, the LNA 204, under a control of the AGC circuit 260 to amplify the input signal and a first stage saturation detector, the saturation detector 206, coupled at an output of the LNA 204 to produce a detector signal that is received by the AGC circuit 260. The output of the LNA 204 is split into two signals along two circuit paths. The first circuit path receives a first portion of the amplified output signal of the LNA 204 and includes a first mixer 210 that mixes the first portion with a first local oscillator signal from the DPLL 228 to produce a first signal, a first second-stage amplifier TIA 212 that amplifies the first signal, a first second-stage saturation detector 214 coupled to an output of the first second stage amplifier to produce a detector signal that is received by the gain control circuit 260, and a first analog to digital converter 216 that converts the first signal output from the first second-stage amplifier into a first digital signal. The second circuit path receives a second portion of the amplified output signal of the LNA 204 and includes a second mixer 220 that mixes the second portion with a second local oscillator signal from the DPLL 228 to produce a second signal, a second second-stage amplifier TIA 222 that amplifies the second signal, a second second-stage saturation detector 224 coupled to an output of the second second-stage amplifier to produce a detector signal that is received by the gain control circuit 260, and a first analog to digital converter 226 that converts the first signal output from the second second-stage amplifier into a second digital signal. The third amplification stage is in the analog to digital converters 216 and 226 which include amplifiers under control by the AGC circuit 260. Coordination of the selection of gain settings in each amplification stage may optimally set the amplification of each amplification stage while avoiding saturation of the received signal at a given node.

The automatic gain control (AGC) module 260 is shown in FIG. 2 as part of the RF DSP 270 to provide the multi-stage gain control based on the indications from the saturation detectors 206, 214 and 224 and the WRSSI module 258. The AGC module 260 receives information from saturation detectors 206, 214, and 224, and the WRSSI module 258, and utilizes the information to control the gain of each of variable gain amplifiers 204, 212, and 222, and the amplification gain in the analog-to-digital converters 216 and 226. The resulting gain settings allow the receiver 200 to operate optimally, for example, by avoiding reduced sensitivity or saturation at any node in the receiver 200. The AGC module 260 may incorporate feedback control to ensure that the setting of the gain controls occurs in a timely manner. Proper operation of the AGC module 260 depends upon the availability of an accurate and relatively instantaneous indication of the strength of the signal after each amplification state, as detected by the saturation detectors 206, 214, and 224, and the WRSSI module 258.

In some implementations, the receiver 200 of FIG. 2 is capable of receiving signals at a single frequency or frequency band. The limitation of the operation of the receiver may be attributed to the analog-to-digital converters 216 and 226 utilized in the receiver. A number of approaches may allow the receiver 200 to receive signals at different frequencies of operation and different bandwidths.

For example, the analog-to-digital converter 216 may be substituted with a first set of analog-to-digital converters for the in-phase component (I) of the received signal, and a multiplexer to select the digital output of one of the set of analog-to-digital converters for use by the RF DSP 270. Similarly, the analog-to-digital converter 226 may be substituted with a second set of analog-to-digital converters for the quadrature component (Q) of the received signal, and a multiplexer to select the digital output of one of the set of analog-to-digital converters for use by the RF DSP 270. The analog-to-digital converters in each set may operate at different frequencies, thereby allowing the receiver 200 to receive signals at different frequencies of operation and different bandwidths. However, adding an additional pair of analog-to-digital converters for each frequency of operation increases the size and area of the receiver 200 and also increases the cost of the receiver 200.

Figure 3:
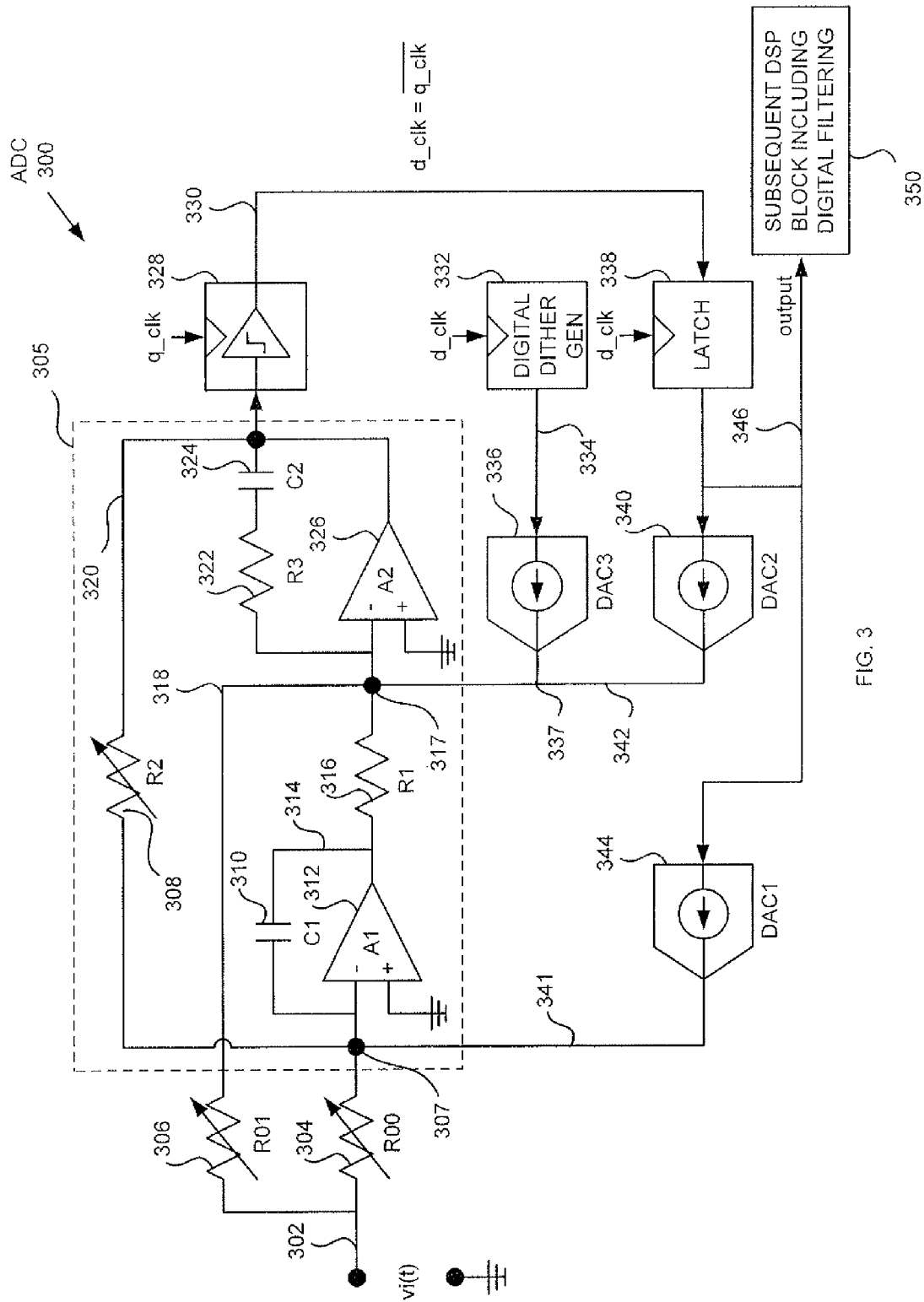
FIG. 3 is a diagram illustrating an exemplary analog-to-digital converter.

FIG. 3 shows an exemplary implementation of a single adjustable analog-to-digital converter (ADC) 300 capable of adjustable operation at two or more signal frequencies or frequency bands, thereby avoiding the need for having separate analog-to-digital converters that are respectively configured and designated for operations at different desired frequencies or frequency bands. The analog-to-digital converter 300 is adjustable to adjust one or more circuit parameters to adapt for operations at different signal frequencies or frequency bands, e.g., adjusting the device gain and/or the device noise transfer function with respect to a signal frequency of operation to significantly reduce or minimize noise at each of the two or more signals frequencies or frequency bands of operation. When utilized to implement the analog-to-digital converters 216 and 226 in the receiver 200 in FIG. 2, the receiver 200 can operate to receive signals at different input signal frequencies or frequency bands of operation without the penalty associated with using sets of analog-to-digital converters.

In FIG. 3, the analog-to-digital converter 300 includes configurable circuit components that allow for operation at different signal frequencies or frequency bands in the frequency range of interest, such as radio frequency bands at 1.50 kHz for FM Radio, 400 KHz for HD-Radio, 1.5 MHz for DAB Radio, and DC for WRSSI. Not only does each band require a different frequency of operation, but different bandwidth and different performance. For DAB mode, analog-to-digital converter 300 may operate at a clock rate of 320 MHz, and for FM and HD-Radio, the analog-to-digital converter 300 may operate at 160 MHz. Table 1 below lists exemplary operating characteristics for each mode of operation for the above three radio modes.

TABLE 1

|  | Bandwidth | Intermediate Frequency (IF) Input Signal | SNDR (Signal to Noise and Distortion Ratio) Requirement |
| --- | --- | --- | --- |
| FM Mode | 150 kHz | 300 kHz~500 kHz | ≥84 dB |
| HD-Radio Mode | 400 kHz | 400 kHz~500 kHz | ≥70 dB |
| DAB Mode | 1.5 MHz | 1.0 MHz~1.5 MHz | ≥64 dB |

The exemplary analog-to-digital converter 300 can be constructed based on a delta sigma modulator design, e.g., a continuous time Delta Sigma modulator design. The continuous time Delta Sigma modulator design can be operated at low operating voltages and low currents to reduce power consumption. The analog-to-digital converter 300 as shown in FIG. 3 is a second order continuous time Delta Sigma modulator ADC with two Delta Sigma modulation feedback loops. ADC designs with more than two Delta Sigma modulation loops or a single Delta Sigma modulation loop may also be implemented as adjustable ADCs based on the technical features in FIG. 3 and other examples provided in this document.

In the example in FIG. 3, the analog-to-digital converter 300 receives an input analog signal 302, e.g., an input voltage signal vi(t) which may be a filtered analog IF signal when the analog-to-digital converter 300 is used in the exemplary receivers in FIGS. 1 and 2. The analog-to-digital converter 300 processes the input analog signal 302 and produces a 1-bit digital signal 346 as its digitized output that represents the input analog signal 302. This conversion of the analog signal 302 into a 1-bit digital output signal 346 is achieved by oversampling the input analog signal 302. Spectral shaping of the digital output signal 346 can be performed by using, e.g., digital passband filtering of the output 346 to reject quantization noise around the desired signal of interest. This operation permits recovery of the desired signal of interest. As viewed in the frequency domain, the desired signal of interest may be relatively narrow in its frequency bandwidth, which may be on the order of hundreds of kilohertz in some applications, in comparison to the sampling rate of the analog-to-digital converter which may be, in some applications, on the order of megahertz. Oversampling also permits the quantization noise inherent in the Delta Sigma modulator design to occur at higher frequencies that are generally greater than the frequency range of interest for the desired signal to recover.

As shown in FIG. 3, the analog-to-digital converter 300 includes first and second integrators with operational amplifiers 312 and 326, a quantizer 328, a digital dither generator 332, a latch 338, and first, second, and third digital-to-analog converters 336, 340, and 344. Each of the operational amplifiers 312 and 326 includes a capacitive feedback coupled between the input and output of the amplifier to form an operational amplifier integrator. The first capacitor C1 310 is coupled in the capacitive feedback loop of the first operational amplifier 312 and the second capacitor C2 324 is coupled in the capacitive feedback loop of the second operational amplifier 3326. Several resistors R00 304, R01 306, R1

316, R2 308 and R3 322 are provided in the ADC 300. Resistors R00 304 and R01 306 are input resistors. Resistor R1 316 is coupled between the two amplifiers 312 and 326. Resistor R2 308 is coupled between the input of the first operational amplifier 312 and the output of the second operational amplifier 326 to form a loop. Resistor R3 322 is coupled in the capacitive feedback loop of the second operational amplifier 326. The two operational amplifiers 312 and 326, the resistors R1 316, R2 308 and R3 322, and capacitors C1 310 and C2 324 form a circuit 305 which effectuates a resonator circuit that has a resonance referred to as a notch frequency of the noise transfer function of the ADC 300. The resonator circuit 305 can be adjusted to tune the notch frequency of the noise transfer function based on the frequency of the received input signal 302 to provide proper noise rejection. The resonator circuit 305 can be adjusted to produce different notch frequencies for different frequencies of the input signal 302 so that the single ADC 300 can be operated for analog to digital conversion for different radio modes without using designated ADCs for different radio modes. In some implementations, capacitors C1 310 and C2 324, and resistors R00 304, R01 306, R1 316, R2 308 and R3 322 can be adjustable components so that their respective component values are adjustable to adapt the device characteristics to a particular signal frequency band. In this context, the circuit 305 that contains the two integrators is an adjustable circuit. The adjustable circuit 305 can be implemented in other configurations. For example, some of these circuit components may be fixed in value while others are adjustable to provide the desired adjustment for operation at different signal frequencies or frequency bands. In the specific examples in this document, capacitors C1 310 and C2 324, and resistors R1 316 and R3 322 are shown as fixed components with fixed component values while resistors R00 304, R01 306, and R2 308 are adjustable components and can be controlled to vary their respective values in response to control signals. The capacitance values for capacitors C1 310 and C2 324 and the resistor values for resistors R1 316 and R3 322 can be selected to minimize area and/or noise of the digitized output 346.

In FIG. 3, the digitized output can be generated either from the output 346 of the latch 338 or from the output 330 of the quantizer 328. This digitized output 346 is directed into a subsequent digital signal processing (DSP) block 350 for further processing. The DSP block 350 can, for example, perform digital signal filtering on the digitized output 346 to control the spectral bandwidth of the digitized output 346. This digital signal filtering can be used to adjust the spectral bandwidth of the digitized output 346 based on the corresponding bandwidth of the input signal 302. In a multi-mode radio receiver for operation under different radio standards such FM, HD or DAB radio mode, for example, the digital signal filtering of the DSP block 350 can be adjustable based on the specified bandwidths associated with the radio modes. The digital signal filtering of the DSP block 350 can be used to set the bandwidth at 150 kHz for FM radio mode, 400 kHz for FM HD radio mode and 1.5 MHz for DAB radio mode. This adjustable bandwidth mechanism in the DSP block 350 removes undesired signals outside the respective signal bandwidth for a particular signal frequency or frequency band and improves the signal quality.

The first and second integrators with operational amplifiers 312 and 326 in FIG. 3 are cascaded so that the output of the amplifier 312 is coupled to the input port of the amplifier 326. Each integrator in FIG. 3 includes an operational amplifier with a negative capacitive feedback loop having a capacitor that performs the signal integration. The input current to the input port is integrated to produce an analog integrator output voltage in each of the first and second integrators. The overall gain of the ADC 300 can be adjusted or varied by adjusting resistors R00 304 and R04 306.

The input port of the amplifier 312 receives the input analog signal 302 Via the adjustable resistor R00 (304) that is connected in series between the input port of the ADC 300 and input port of the amplifier 312. The adjustable resistor R01 (306) is connected between the input port of the ADC 300 and the input port of the amplifier 326. Both adjustable resistors R00 (304) and R01 (306) can be adjusted to vary the gain of the ADC 300. The adjustable resistor R2 308 is coupled between the input port of the amplifier 312 and the output port of the amplifier 326 to provide a mechanism for adjusting the notch frequency and associated bandwidth of the noise transfer function of the ADC 300. The value of the adjustable resistor R2 308 can be adjusted to shift the center of the notch of the noise transfer function of the ADC 300 to be at or near the center of a particular signal frequency or frequency band of operation to minimize the noise within the bandwidth of the signal and to increase a high signal to noise ratio. When the signal frequency of operation is changed, the value of the adjustable resistor R2 308 is adjusted accordingly to overlap the notch of the noise transfer function with the changed signal frequency. In the specific example shown in FIG. 3, other resistors and capacitors in the ADC 300 can be fixed in value. For example, the capacitor C1 (310) is coupled between the input and the output of the amplifier 312 and is shown as a fixed capacitor. The resistor R1 (316) is connected in series between the output of the amplifier 312 and the input of the amplifier 326 and is shown as a fixed resistor. The resistor R3 (322) and the capacitor C2 (324) are connected in series and are coupled between the input and output of the amplifier 326 and are shown as fixed value components. In other implementations, one or more of these components may also be made adjustable to provide additional tuning mechanisms for the ADC 300. The capacitance values for capacitors C1 (310) and C2 (324) can be set small to reduce sizes of the capacitors in the ADC 300.

The continuous time Delta Sigma modulator design for the ADC 300 in FIG. 3 includes two Delta Sigma modulation loops that have a common shared digital portion that includes the quantizer 328 and the latch 338. The latch 338 is used as a delay element to cause a delay in the digital data bit stream output 330 of the quantizer 328 and to produce the digitized 1-bit output 346. This delayed digital data bit stream 346 is used here to facilitate the operation of the DAC1 and DAC2 in the two loops. Alternatively, the output of the ADC 300 can be taken from the output 330 of the quantizer 330.

A portion of the digitized 1-bit output 346 is used as the feedback to the two Delta Sigma modulation loops by splitting into first and second digital feedback signals which are used to produce first and second analogy feedback signals 341 and 342. The first Delta Sigma modulation loop includes the DAC1 344 which is coupled between a summing node 307 for the amplifier 312 and the latch 338. The summing node 307 is located between the resistor R00 and the input port of the amplifier 312 to add the input signal 302 and the first analog feedback signal as the input to the amplifier 312. The first digital feedback signal is directed to the input of the DAC1 344 which produces the first analog feedback signal 341. The second Delta Sigma modulation loop includes the DAC2 340 which is coupled between a summing node 317 for the amplifier 326 and the latch 338. The summing node 317 is located between the resistor R1 (316) and the input port of the amplifier 326 to add the output of the amplifier 312 and the second analog feedback signal 342 as the input to the amplifier 326. The second digital feedback signal is directed to the input of the DAC2 340 which produces the second analog feedback signal 342.

The resistance of configurable resistors R00 304 and R01 306, and resistor R2 308 may be adjusted to adjust or change the gain and the notch frequency of the noise transfer function of the analog-to-digital converter 300, respectively. The resistance values of resistors R00 304, R01 306, and R2 308 may be controlled by the CPU 160 of FIG. 1 by, e.g., configuring one or more programmable registers.

Exemplary resistance values for resistor R 1316, configurable resistor R2 308, and resistor R3 322, and capacitance values for capacitor C1 310 and C2 324, are shown below in Table 2, for analog-to-digital conversion of IF signals received in accordance with FM, HD-Radio, and DAB broadcasting standards. The signal bandwidth of the analog-to-digital converter 300 may be configured by adjusting the resistance value of configurable resistor R2 308.

TABLE 2

| | R1 | R2 | R3 | C1 | C2 |
|---|---|---|---|---|---|
| FM Mode | 118 kΩ | 2.5 MΩ | 15.0 kΩ | 1000fF | 500fF |
| HD-Radio Mode | 118 kΩ | 1.5 MΩ | 15.0 kΩ | 1000fF | 500fF |
| DAB Mode | 118 kΩ | 2.0 MΩ, 1.5 MΩ, 1.0 MΩ, 0.5 MΩ, or 0.375 MΩ | 15.0 kΩ | 1000fF | 500fF |

Configurable resistor R2 308 adjusts the notch frequency in accordance with the required signal characteristics of the received signal. For example, if the FM mode analog IF input signal 302 is at 375 kHz, and the bandwidth is 150 kHz in FM mode, then the frequency range of interest is 300 kHz-450 kHz (375 kHz+/−75 kHz), the notch frequency is adjusted to 375 kHz using the following equation to select component values or program the resistance of resistor R2 308:

$$Z_{1,2} = \frac{C_2 R_3}{2C_1 C_2 R_1 R_2} \pm \frac{\sqrt{C_2^2 R_3^2 + 4C_1 C_2 R_1 R_2}}{2C_1 C_2 R_1 R_2} \approx \pm \frac{j}{\sqrt{|C_1 C_2 R_1 R_2|}}$$

As previously mentioned, the input gain of the analog-to-digital converter 300 may be adjusted by programming the resistance values of resistors R00 304 and R01 306. Table 3 illustrates exemplary input gain values achieved with various configurations of R00 and R01,

TABLE 3

| Gain/Full Scale (FS) Peak Input | R00 | R01 |
|---|---|---|
| Gain: 18 dB FS = 50 mV | 4.0 kΩ | 18.0 kΩ |
| Gain: 12 dB FS = 100 mV | 8.0 kΩ | 36.0 kΩ |
| Gain: 6 dB FS = 200 mV | 16.0 kΩ | 72.0 kΩ |
| Gain: 0 dB FS = 400 mV | 32.0 kΩ | 144.0 kΩ |

The overall gain of the receiver 170 in FIG. 1 may be at least partially controlled through configuration of the input gain of the analog-to-digital converter 300. In the example in FIG. 3, the gain of the ADC 300 can be controlled and adjusted by adjusting the adjustable resistors R00 304 and R01 306. In one implementation, the adjustable resistors R00 304 and R01 306 are adjusted together to minimize the change in the nose transfer function of the device associated with adjusting the resistors R00 304 and R01 306.

The quantizer 328 is coupled at the output of the second stage integrator based on the amplifier 326. The quantizer 328 converts the analog output of the second integrator into discrete quantized values respectively representing quantized levels of the analog output. The quantizer 328 is operated at a quantization rate that is controlled by an input quantization clock signal q_clk. The quantization may be performed at a variable rate, such as a rate between 320 MHz and 160 MHz. The quantization rate may be varied, as well as the order of the continuous time Delta Sigma modulator. In one implementation, for the DAB mode, the q_clk of the analog-to-digital converter 300 can be at 320 MHz, and for FM and HD-Radio modes, the q_clk of the analog-to-digital converter 300 can be at 160 MHz.

The digital-to-analog converters 340 and 344 complete the feedback loops for operational amplifiers 326 and 312, respectively, by each injecting a feedback current to a respective amplifier. Such a feedback current is fed back to each operational amplifier 326 or 312 to maintain the stability of the circuit and the appropriate spectral shape for the noise power of the quantization noise. The feedback currents provided through the digital-to-analog converters 340 and 344 may be independently adjusted. As the frequency of operation (q_clk) of the analog-to-digital converter 300 is increased, the feedback current provided by each of the digital-to-analog converters 340 and 344 is also increased. In one implementation, if the q_clk frequency is doubled, the feedback current is also approximately doubled.

In one implementation, the digital-to-analog converters 340 and 344 are implemented using resistors. In one example, the first digital-to-analog converter 344 provides a feedback current of +/−18.33 uA and the second digital-to-analog converter 340 provides a feedback current of +/−2.93 uA. If the digital-to-analog converters 340 and 344 are implemented using programmable resistors, the resistance values (and thus the magnitude of feedback current provided) may be configured by control circuitry such as the CPU 160 of FIG. 1.

In the analog-to-digital converter 300 of FIG. 3, dither is introduced by the digital dither generator block 332 to improve the performance of the quantizer 328. Dither is a small amount of random or pseudo-random noise (sometimes referred to as white noise) introduced before the quantizer block 328. The introduction of dither causes the state of the quantizer output 330 to oscillate randomly between a logic "0" and a logic "1" when the input analog signal 302 is at a low level. Without dithering, the output 330 of the quantizer 328 could, undesirably, remain at a logic "0" for extended periods of time. With dithering, low level analog input signals are not simply truncated to 0 by the 1-bit quantizer 328. Thus, dithering extends the dynamic range of analog signals that the analog-to-digital converter can digitize. The small increase in noise at the output 346 of the analog-to-digital converter 300 can be insignificant or kept at minimal over time.

In the example shown in FIG. 3, the dithering for the quantizer 328 is implemented by the operation of the digital dither generation block 332 and the third digital-to-analog converter 336. The third digital-to-analog converter 336 is coupled to the input port of the amplifier 326 of the second integrator and the digital dither generation block 332 is coupled to the digital input of the third digital-to-analog converter 336. In Operation, the digital dither generation block 332 generates a random digital output 334, such as a random or pseudo random sequence of logic "1" or logic "0" values under control of a clock signal d_clk. The clock signal d_clk can be different from the quantization clock signal q_clk. In the specific example shown in FIG. 3, the clock signal d_clk can be the inverted clock signal of the quantization clock signal q_clk and the same clock signal d_clk is also used to control the operation of the latch 338 as part of the feedback loop for the second integrator based on the amplifier 326 and the feedback loop for the first integrator based on the amplifier 312. The digital dither generation block 332 is operated to produce the dithering digital output 334 with a dither data bit rate less than the clock rate of the clock signal d_clk, e.g., one half of the data rate of the output 330 from the quantizer 328. This dithering digital output 334 is converted by the third digital-to-analog converter 336 into an analog dither current signal that is combined with the feedback current 342 from the digital-to-analog converter 340 at a summing node 337 and the combined current is injected into the input port of the amplifier 326. This analog dither current signal is combined with the output current from the first integrator based on the amplifier 312 and the feedback current from the feedback loop with the digital-to-analog converter 340 and the latch 338 as the input to the amplifier 326 which produces a dithered analog signal at the output of the amplifier 326 (or the output of the adjustable resonator circuit 305) to be subsequently quantized at the quantizer 328. Alternatively, the circuitry block of the digital dither generation block 332 and the third digital-to-analog converter 336 can be coupled between the node 307 and the first digital-to-analog converter 344 to combine with the feedback current 341 and the combined current is injected into the input port of the on the amplifier 312. This also produces a dithered analog signal at the output of the amplifier 326 (or the output of the adjustable resonator circuit 305). This current injection mode of dithering can be advantageous over a voltage-mode dithering that adds a dithering analog voltage signal at the input of the quantizer 328. In one implementation, the digital-to-analog converter 336 is implemented using a resistor. If the digital-to-analog converter 336 is implemented using a programmable resistor, the resistance value may be configured by control circuitry such as the CPU 160 of FIG. 1 In one implementation, the third digital-to-analog converter 336 provides a randomized feedback current of either +0.25 uA or −0.25 uA to the input node 318 of the operational amplifier 326.

In other implementations not shown in FIG. 3, the digital dither generation block 332 may accept output data 330 from the quantizer 328 as an input in generating the dither data output 334. The digital dither generation block 332 may use input data at a reduced data rate (less than q_clk) or may update its output at a reduced data rate (less than q_clk) in order to reduce the overall power consumption of the analog-to-digital converter 300.

In one implementation, the output of the digital dither generator 332 is configured depending on whether the analog-to-digital converter 300 digitizes received FM, HD-Radio, or DAB signals. The output of the third digital-to-analog converter 336 has a noise spectral profile of the noise power as a function of the frequency depending on how the digital dither generation block 332 and the digital-to-analog converter block 336 are configured. For example, the configurable output current of the digital-to-analog converter 340 or the configurable updating rates to the dither data output of the digital dither generation block 332 may effect the noise profile of the quantizer output 330. The noise spectral profile of the digital dither generator 332 and digital-to-analog converter 336, as observed at the output 330 of the quantizer 328, may be configured to minimize introduced noise at the bandwidth range of interest, such as 375 kHz+/−75 kHz for FM mode. Accordingly, the digital dither generation block 332 can be a digitally programmable dither generation block that generates a particular dither current that produces a desirable shaped noise spectral profile for the ADC 300 based on the radio frequency or frequency band of a particular radio mode and produces different dither currents that produce differently shaped noise spectral profiles for the ADC 300 for different radio modes.

Figure 4:
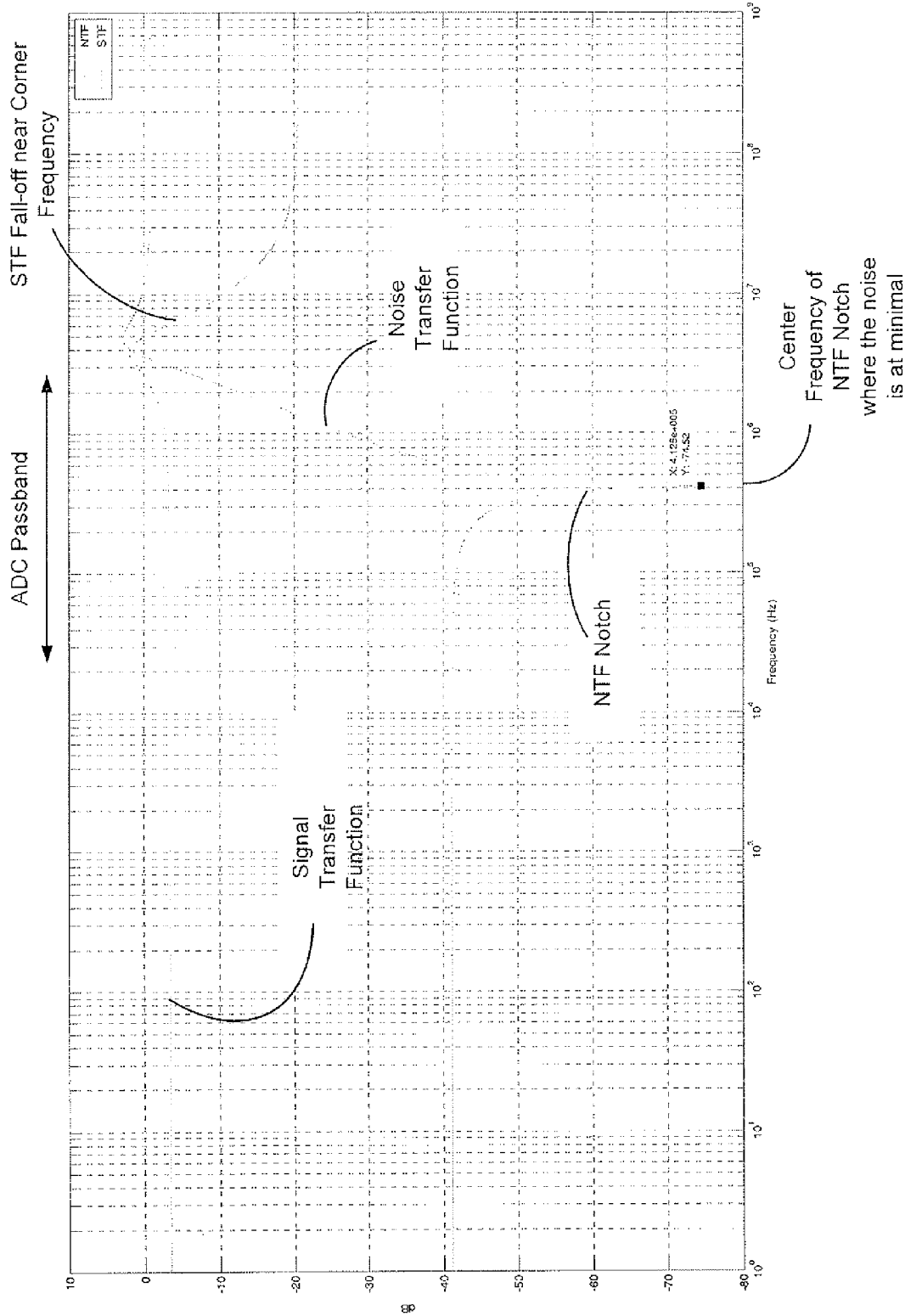
FIG. 4 illustrates an example of the signal transfer function and the noise transfer function with respect to signal frequency of the ADC in FIG. 3

FIG. 4 illustrates an example of the signal transfer function and the noise transfer function with respect to signal frequency of the ADC 300 in FIG. 3. The signal transfer function (STF) exhibits a frequency response with a low-pass characteristic, i.e., passing low-frequency signals while attenuating high-frequency signals. The frequency response has a fall-off beyond a high frequency known as the corner frequency which can be defined as the frequency at which the signal gain drops by 3 dB. Because of this low-pass frequency property, the ADC 300 is operated to convert analog signals at frequencies in the passband of the ADC which is below the ADC corner frequency.

The noise transfer function (NTF) of the ADC 300 exhibits a very different spectral profile from the signal transfer function. Notably, the NTF spectral profile has a notch profile in which the noise at the center of the notch is at the minimal or lowest while noise increases to various levels above the lowest noise level at other frequencies. Therefore, within the ADC passband spectral range below the ADC corner frequency, the frequency of the center of the NTF notch should be set to or near the center of a signal frequency or frequency band to suppress the noise. For the ADC 300 in FIG. 3, the center of the NTF notch is determined by C1, C2, R1, R2 and R3:

$$Z_{1,2} = \frac{C_2 R_3}{2 C_1 C_2 R_1 R_2} \pm \frac{\sqrt{C_2^2 R_3^2 + 4 C_1 C_2 R_1 R_2}}{2 C_1 C_2 R_1 R_2} \approx \pm \frac{j}{\sqrt{|C_1 C_2 R_1 R_2|}}$$

Hence, in general, any one or a combination of values of C1, C2, R1, R2 and R3 can be adjusted to tune the NTF notch frequency and C1, C2, R1 and R2 may be selected to provide the desired tuning. For example, both R1 and R2 may be adjusted to provide the tuning. Therefore, in implementations where C1, C2, R1 and R3 are fixed in value, the adjustable resistor R2 is adjusted to shift the frequency of the center of the NTF notch within the ADC passband spectral range to or near the signal frequency or the center of the signal frequency band of the input signal 302. More specifically, in a multi-mode radio receiver (e.g., the example in FIG. 2), as the radio mode changes, the adjustable resistor R2 (e.g., within the ADC 216 or 226 in FIG. 2) is adjusted to overlap the frequency of the center of the NTF notch with the signal frequency or the center of the signal frequency band of the IF signal 302 produced by the signal mixer (e.g., the signal mixer 210 or 220 in FIG. 2). The bandwidth of the NTF notch can be further controlled by the subsequent digital signal filtering in the DSP block 350 in FIG. 3 and is set based on the respective signal bandwidth of a particular radio mode, e.g., 150 kHz for FM radio mode, 400 kHz for FM HD radio mode and 1.5 MHz for DAB radio mode.

Referring to FIG. 3, the resistor R3 322 is connected in series with the capacitor C2 324 in the capacitive feedback loop that performs the signal integration in the second integrator. The presence of the resistor R3 322 can affect the frequency of the center of the NTF notch which is determined by C1, C2, R1, R2 and R3 and can also be used to control the profile of the NTF at high frequencies above the frequency of the center of the NTF notch. The value of the resistor R3 322 is selected with respect to other circuit parameters to ensure that the amplitude of the NTF notch at high frequencies above the frequency of the center of the NTF notch is free of large volatility and thus preserves the stable operation of the ADC 300. The example in FIG. 3 is for a two-loop second order delta sigma ADC design in which the resistor R3 322 is connected in the feedback loop of the second integrator. For an implementation of the adjustable ADC with only a single delta sigma modulation loop, the resistor R3 322 is implemented in the in the capacitive feedback loop of the single integrator. For implementations of the adjustable ADC with only more than two delta sigma modulation loops, the resistor R3 322 can be implemented in the capacitive feedback loop of any integrator downstream from the first integrator or in two or more integrators down stream from the first integrator.

In implementing the above described adjustable ADC devices for operating at different signal frequencies or frequency bands, the values of the adjustable circuit components, such as R00 and R01 for adjusting the ADC gain and R2 for adjusting the frequency of the center of the NTF of the ADC, can be selected of each signal frequency or frequency band with desired or optimized operation to form a database that includes a set of values of the adjustable circuit components with respect to different signal frequencies or frequency bands of operation. This database can be stored in a memory of an ADC control circuit (e.g., as part of the firmware of the radio) for controlling the adjustable ADC (e.g., the CPU 160 in FIG. 1 or part of the RF DSP 270 in FIG. 2).

Figure 5:
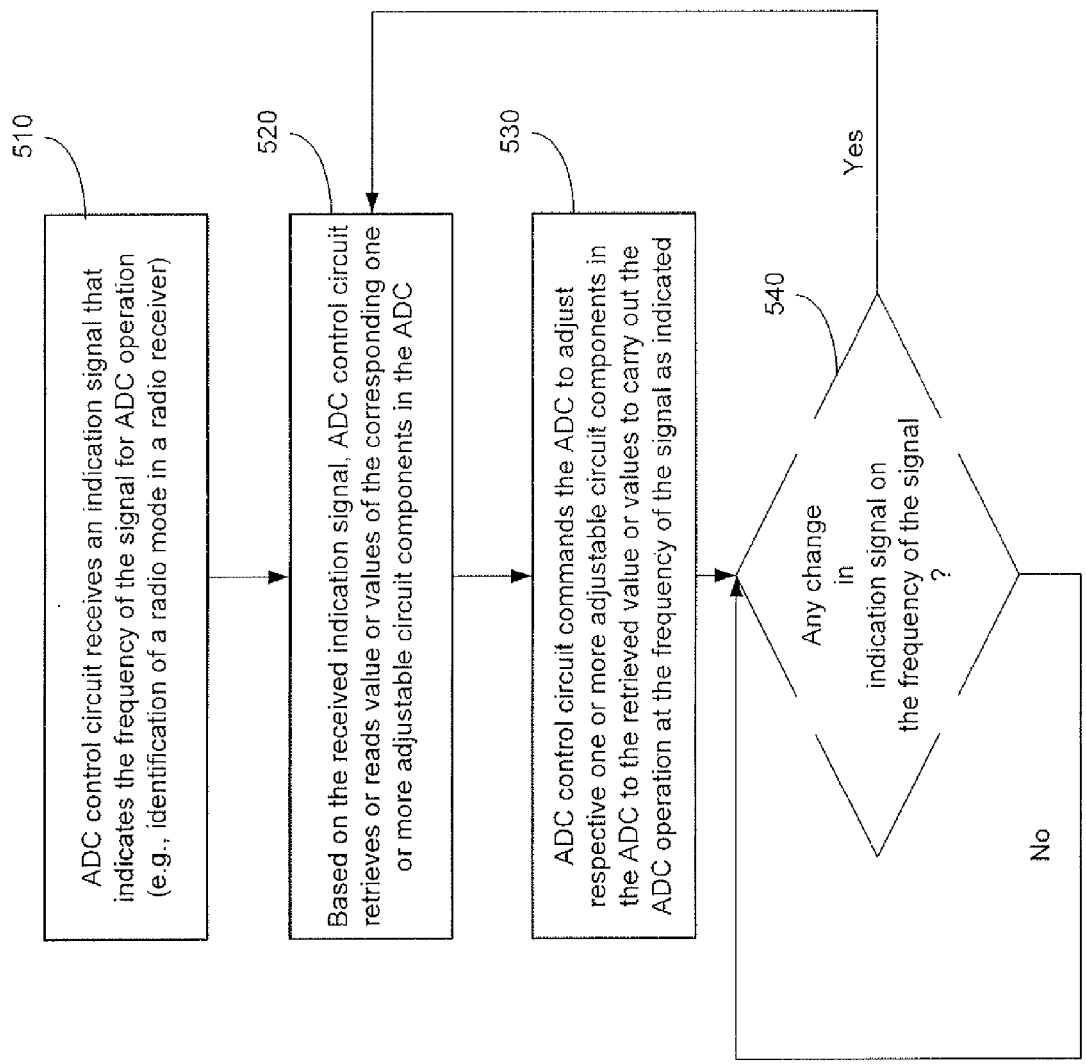
FIG. 5 shows an example of the operational flow for operating an adjustable ADC.

In operation, the ADC control circuit receives an indication signal that indicates the frequency of the signal for the ADC operation (e.g., identification of a radio mode in a radio receiver), and, based on the received indication signal, the ADC control circuit retrieves or reads the corresponding value or values of the corresponding one or more adjustable circuit components in the ADC, e.g., a set of values for the adjustable circuit components in the ADC. Next, the ADC control circuit commands the ADC to adjust respective one or more adjustable circuit components in the ADC to the retrieved value or values to carry out the ADC operation at the frequency of the signal as indicated. FIG. 5 shows a flowchart of the above ADC operation process with steps 510, 520 and 530 for operating an adjustable ADC. After the step 530 is performed, the ADC remains at the same circuit configuration if the indication signal does not indicate a change in the frequency of the signal for the ADC operation (step 540). When the signal frequency or radio mode changes, steps 520 and 530 are repeated again to adjust the ADC for operation at the new signal frequency or frequency band. In the example described above with respect to FIG. 3, the resistor values for the R00, R01 and R2 and bandwidth values for the digital signal processing in the DSP block 350 for different signal frequencies or frequency bands can be stored in the ADC control circuit memory. This stored information is then used to set the gain, the notch frequency and the notch bandwidth of the NTF by controlling the R00, R01 and R2 and the DSP block 350.

In addition, the ADC control circuit can also be coupled to control the digitally programmable dither generation block 332 to adjust the dither signal 334 for properly shaping the noise spectrum in the ADC 300. Based on the indication signal that indicates the frequency of the signal for the ADC operation (e.g., identification of a radio mode in a radio receiver) at step 510 in FIG. 5, the ADC control circuit controls the digitally programmable dither generation block 332 to produce a corresponding digital dither signal 334 that is configured for the respective radio mode as indicated by the indication signal. This control of the digitally programmable dither generation block 332 is performed while the one or more adjustable circuit components are adjusted in step 530. After the digitally programmable dither generation block 332 is adjusted to produce a particular dither signal 334, the dither signal 334 is maintained if the indication signal does not indicate a change in the frequency of the signal for the ADC operation. When the signal frequency or radio mode changes, the digitally programmable dither generation block 332 is adjusted to produce a different dither signal 334 for the newly changed frequency while steps 520 and 530 are performed to adjust the respective one or more adjustable circuit components. In this example, both the adjustment of one or more adjustable circuit components and the adjustment of the digitally programmable dither generation block 332 are made in response to a change in the input signal frequency or the radio mode.

In some implementations, a switchable feedback path for ADC may be used to automatically detect the change of the frequency in the received input signal 302 in FIG. 3 and, based on this auto detection, the ADC control circuit automatically adjusts the ADC settings based on the flow in FIG. 5. In other implementations, e.g., a multi-mode radio receiver, a user can select the radio mode of the radio receiver, e.g., switching from an AM radio station to an FMHD radio station. This user selection can be used as the indication signal to indicate the change of the radio station and thus is used by the ADC control circuit to automatically adjust the ADC settings based on the flow in FIG. 5 and the digitally programmable dither generation block 332.

Figure 6:
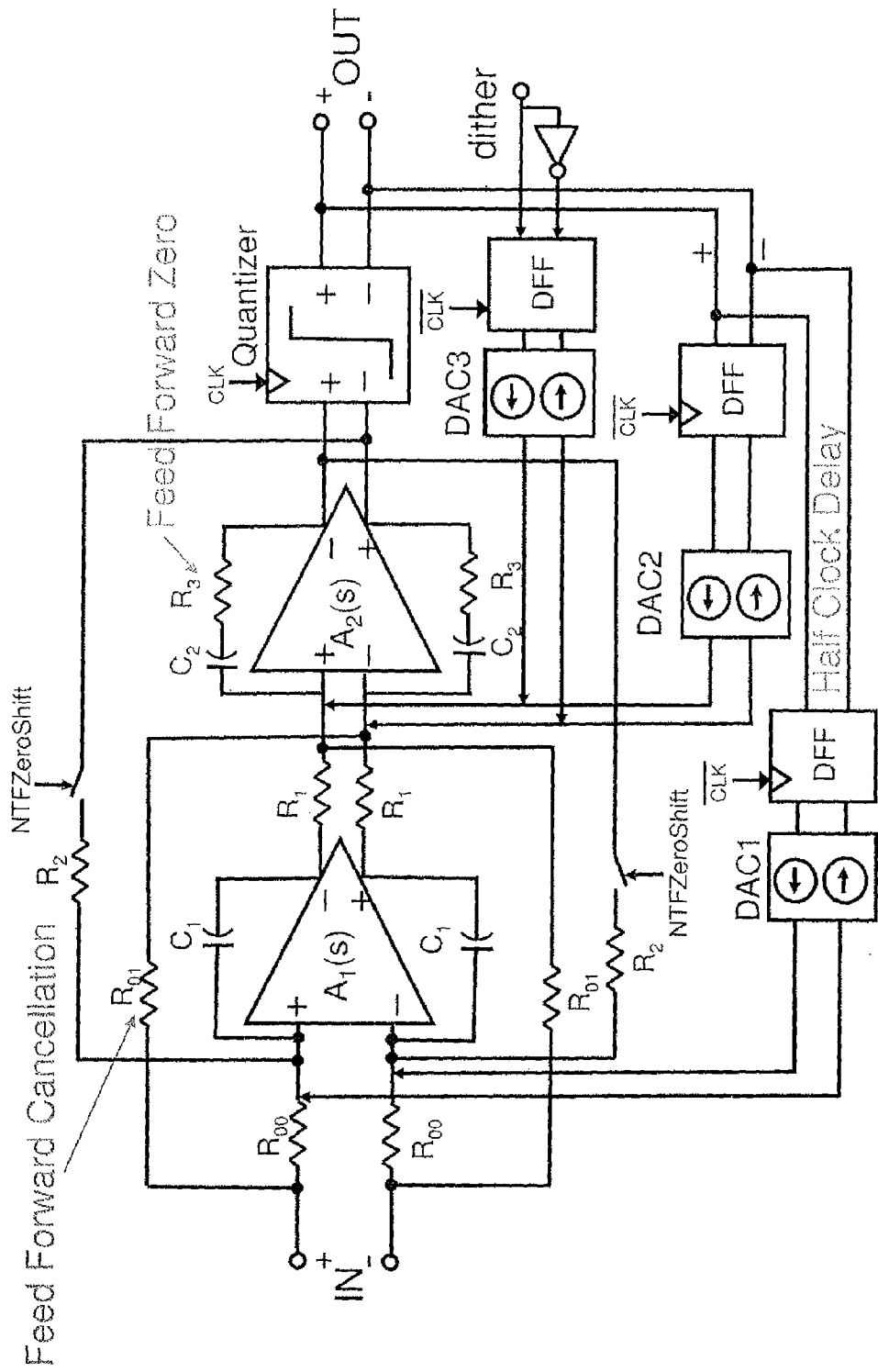
FIG. 6 shows an example of an adjustable ADC based on the differential mode.

The adjustable ADC 300 in FIG. 3 uses a single input at each operational amplifier where one of the inputs of the operational amplifiers is grounded. Alternatively, each operational amplifier can be operated in a differential input mode where one of the inputs is at a positive potential and the other input is at a negative potential. This differential mode can be used to reduce the common noise. FIG. 6 shows an example of an adjustable ADC based on the differential mode.

A few embodiments have been described in detail above, and various modifications are possible. The disclosed subject matter, including the functional operations described in this document, can be implemented in electronic circuitry, computer hardware, firmware, software, or in combinations of them, such as the structural means disclosed in this document and structural equivalents thereof, including potentially a program operable to cause one or more data processing apparatus to perform the operations described, such as a program encoded in a computer-readable medium, which is a non-transitory medium which retains information recorded therein. Examples of such media include, e.g., a memory device, a storage device, a machine-readable storage substrate, or other physical, machine-readable medium, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this document contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Only a few implementations and examples ate described and other implementations, enhancements and variations can be made based on what is described and illustrated in this document.

The invention claimed is:

1. An analog-to-digital converter comprising:
   an adjustable resonator circuit having an integrator configured to produce an integrated analog signal based on an analog input signal;
   a quantizer coupled to receive said integrated analog signal and configured to produce a digital output based on said integrated analog signal;
   a first digital-to-analog converter configured to produce a random current to said integrator; and
   a feedback loop that includes a second digital-to-analog converter.

2. An analog-to-digital converter comprising:
   an adjustable resonator circuit having an integrator configured to produce an integrated analog signal based on an analog input signal, wherein said integrator includes one or more circuit components adjustable in response to different signal frequencies of said analog input signal;
   a quantizer coupled to receive said integrated analog signal and configured to produce a digital output based on said integrated analog signal; and
   a first digital-to-analog converter configured to produce a random current to said integrator.

3. The analog-to-digital converter of claim 1, wherein said digital-to-analog converter converts said digital output of said quantizer into a first analog feedback current coupled to an input port of said integrator.

4. The analog-to-digital converter of claim 1, wherein said integrator includes an operational amplifier having a capacitive feedback loop to form an operational amplifier integrator.

5. The analog-to-digital converter of claim 4, further comprising a resistor coupled in said capacitive feedback loop of said operational amplifier.

6. The analog-to-digital converter of claim 4, wherein said integrator includes an input operational amplifier receiving said analog input signal and producing an output to said operational amplifier integrator, said input operational amplifier having a capacitive feedback loop to form an input operational amplifier integrator.

7. The analog-to-digital converter of claim 1, further comprising:
   an adjustable input resistor coupled to an input port of said integrator to adjust a signal gain of said integrator.

8. The analog-to-digital converter of claim 1, wherein said integrator includes an adjustable resistor coupled between an input port and an output port of said integrator to change a frequency of a response of said analog-to-digital converter.

9. The analog-to-digital converter of claim 1, further comprising:
   a digital signal processing block.

10. An integrated circuit radio receiver comprising:
    receiver circuitry receiving an input signal based on one of a plurality of different radio broadcast standards; and
    an analog-to-digital converter comprising:
        an adjustable circuit having a first integrator producing an integrated analog signal based on an intermediate frequency (IF) analog signal produced by said receiver circuitry; and
        a control circuit configured to control at least one adjustable circuit component of said adjustable circuit to adapt operation of said analog-to-digital converter to said input signal.

11. The integrated circuit radio receiver of claim 10, wherein said control circuit controls said at least one adjustable circuit component to shift a frequency of a notch of a noise transfer function of said analog-to-digital converter.

12. The integrated circuit radio receiver of claim 10, wherein said adjustable circuit includes an adjustable resistor controlled by said control circuit to shift a frequency of a notch of a noise transfer function of said analog-to-digital converter.

13. The integrated circuit radio receiver of claim 10, wherein said adjustable circuit includes a second integrator.

14. The integrated circuit radio receiver of claim 10, wherein said analog-to-digital converter includes an adjustable input resistor coupled to said first integrator and controlled by said control circuit to adjust a gain of said analog-to-digital converter.

15. The analog-to-digital converter of claim 2, wherein said digital-to-analog converter converts said digital output of said quantizer into a first analog feedback current coupled to an input port of said integrator.

16. The analog-to-digital converter of claim 2, wherein said integrator includes an operational amplifier having a capacitive feedback loop to form an operational amplifier integrator.

17. The analog-to-digital converter of claim 16, further comprising:
    a resistor coupled in said capacitive feedback loop of said operational amplifier.

18. The analog-to-digital converter of claim 16, wherein said integrator includes an input operational amplifier receiving said analog input signal and producing an output to said operational amplifier integrator, said input operational amplifier having a capacitive feedback loop to form an input operational amplifier integrator.

19. The analog-to-digital converter of claim 2, further comprising:
    an adjustable input resistor coupled to an input port of said integrator to adjust a signal gain of said integrator.

20. The analog-to-digital converter of claim 2, wherein said integrator includes an adjustable resistor coupled between an input port and an output port of said integrator to change a frequency of a response of said analog-to-digital converter.

\* \* \* \* \*

UNITED STATES PATENT AND TRADEMARK OFFICE
CERTIFICATE OF CORRECTION

PATENT NO. : 9,077,366 B2
APPLICATION NO. : 13/969549
DATED : July 7, 2015
INVENTOR(S) : Henrik Thoistrup Jensen et al.

It is certified that error appears in the above-identified patent and that said Letters Patent is hereby corrected as shown below:

Title Page, Item (57) Abstract - delete "hands" after frequency and insert --bands--

Signed and Sealed this
Twenty-ninth Day of December, 2015

Michelle K. Lee
*Director of the United States Patent and Trademark Office*